United States Patent [19]

Iijima

[11] 4,310,764
[45] Jan. 12, 1982

[54] ELECTRON BEAM IRRADIATION APPARATUS

[75] Inventor: Nobuo Iijima, Yokohama, Japan

[73] Assignee: Fujitsu Limited, Kawasaki, Japan

[21] Appl. No.: 158,356

[22] Filed: Jun. 11, 1980

[30] Foreign Application Priority Data

Jun. 12, 1979 [JP] Japan .................. 54-72976

[51] Int. Cl.³ .................................. G01M 21/00
[52] U.S. Cl. .................. 250/440; 250/311; 250/442; 250/400
[58] Field of Search ............ 250/311, 400, 440, 442

[56] References Cited

U.S. PATENT DOCUMENTS

| | | | |
|---|---|---|---|
| 3,218,457 | 11/1965 | Van Dorsten | 250/311 |
| 3,283,120 | 11/1966 | Spruck | 250/311 |
| 3,909,611 | 9/1975 | Rauch | 250/440 |

FOREIGN PATENT DOCUMENTS 402965  3/1974  U.S.S.R. .................. 250/440

*Primary Examiner*—Harold A. Dixon
*Attorney, Agent, or Firm*—Staas & Halsey

[57] ABSTRACT

An electron beam irradiation apparatus which comprises: a base plate of a magnetically permeable material; a movable stage mounted on said base plate; an upper magnetic shield plate having an electron beam passage hole disposed above said stage; a side member of high permeability which magnetically interconnects said base plate and said upper shield plate, and; a magnetic shield cover plate which covers the table surface of said stage.

15 Claims, 8 Drawing Figures

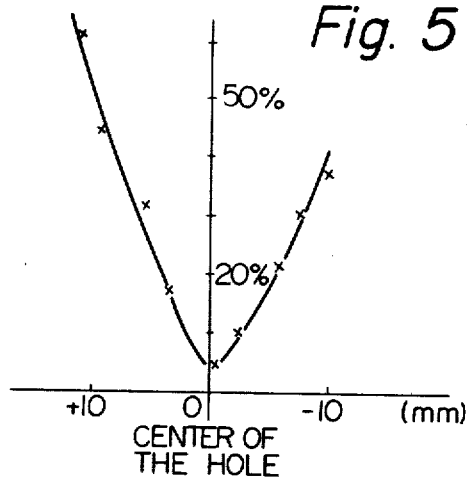
Fig. 5
Fig. 6
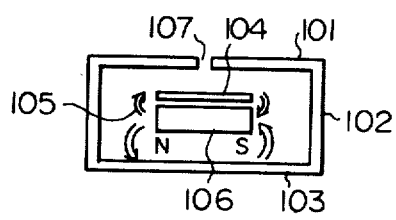
Fig. 7
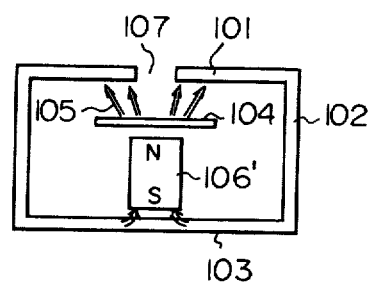
Fig. 8
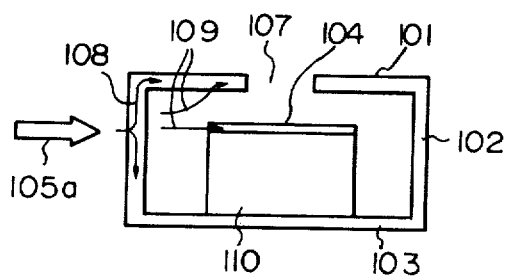

ELECTRON BEAM IRRADIATION APPARATUS

BACKGROUND OF THE INVENTION

The present invention relates to an electron beam irradiation apparatus, such as an electron beam exposure apparatus or an electron microscope, and more particularly, it relates to a magnetic shield construction for avoiding magnetic disturbance against the irradiated electron beam.

An electron beam irradiation apparatus is used in a pattern formation process for producing semiconductor devices or in an electron microscope for inspecting the formed patterns of semiconductor devices. A movable stage, such as an XY stage, is installed within a vacuum chamber of the electron beam irradiation apparatus. An electron beam is applied to a specimen placed on a table of the XY stage. An XY stage of high speed and high positioning accuracy is used, especially in the exposure apparatus, for forming the semiconductor patterns. If movable parts of the XY stage are made of a ferromagnetic substance, magnetism from the XY stage changes as the table moves. This causes the path of the electron beam to be deflected, so that a desired pattern cannot be obtained. Making the XY stage a non-ferromagnetic substance involves a great deal of trouble in processing and causes the cost to be high. Even if the XY stage is made of a non-ferromagnetic substance, magnetism from a drive system or other movable parts outside the XY stage affects the electron beam.

SUMMARY OF THE INVENTION

The present invention was made considering the above points. It is an object of the present invention to provide a magnetic shield construction for a movable stage such as an XY stage, so as to make it possible to produce the XY stage with a ferromagnetic material, such as iron, which is cheap and can be treated with a high cutting or processing accuracy. The magnetic shield construction of the present invention protects the electron beam from the effects of the magnetism of the XY stage or outer parts without degrading the functional ability of the XY stage. According to the present invention, an XY stage is mounted on a base plate of high permeability. An upper magnetic shield plate, having an opening for an electron beam, is disposed above the XY stage. This upper magnetic shield plate is magnetically connected to said base plate through side plates or pillars of high permeability. The table surface of the XY stage is covered by a magnetic shield cover plate. The structural members of a vacuum chamber may serve as said base plate or side plates.

BRIEF DESCRIPTION OF THE DRAWINGS

FIG. 3, FIG. 4 and FIG. 5 are graphical views of experimental results representing the magnetism value at a point above the XY stage.

FIG. 6 through FIG. 8 are views for explaining the principle of the magnetic shield according to the present invention.

DETAILED DESCRIPTION OF THE PREFERRED EMBODIMENTS OF THE INVENTION

Figure 1:
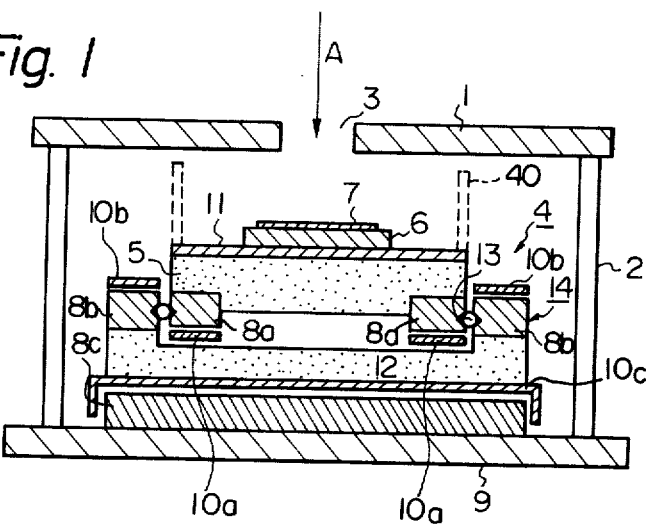
FIG. 1 is a schematic sectional view of an embodiment of a magnetic shield constructed according to the present invention.

An embodiment of the present invention is illustrated in a sectional view in FIG. 1. An XY stage 4 is mounted on a base plate 9 of a high permeable material, such as pure iron. Pillars 2 of pure iron are mounted on the base plate 9. An upper magnetic shield plate 1 of a high permeable material (permalloy, ferrite etc.) is disposed above the XY stage 4 and supported by the pillars 2. In this arrangement, the base plate 9 and the shield plate 1 are magnetically interconnected through the pillars. A passage hole 3 for an electron beam (arrow A) is formed at the center of the upper magnetic shield plate 1. The surface of a table 5 of the XY stage 4 is covered by a magnetic shield cover plate 11 of a permalloy or the like having the same dimensions as the table surface. A wafer holder 6 is mounted on the table 5. A wafer 7, such as a silicon substrate, to which the electron beam is to be applied, is placed on the wafer holder 6. The Y table 5 is mounted on an X table 12 through guide means 14, which are made of a magnetic material, such as iron or the like. The Y table 5 and the X table 12 are made of, for example, an aluminum alloy. Each of the guide means 14 comprises a steel ball 13 and a pair of guide rails 8a and 8b, one of which (8a) is secured to the Y table 5 while the other (8b) is secured to the X table 12. The guide means 14 is connected to a drive means which comprises a drive screw (not shown), a motor (not shown) and a magnetic fluid rotation introducer (not shown) disposed within the vacuum chamber. The lower surface of the guide rail 8a, which rail is secured to the Y table 5, is covered by a magnetic shield plate 10a, made of a permalloy or the like. The upper surface of the guide rail 8b which rail is secured to the X table 12, is covered by a magnetic shield plate 10b, made of a permalloy or the like. Similarly, a guide means for the X direction (8c) is arranged between the X table 12 and the base plate 9. Also, the upper surface of the other guide rail 8c secured to the base plate 9 is covered by another magnetic shield plate 10c.

In the XY stage 4 of the above mentioned construction, since the whole XY stage is magnetically enclosed by a material of a high permeability, such as a permalloy, it is possible to decrease the magnetism above the table and depress the magnetism change caused by the XY stage movement. Therefore, the magnetic disturbance by the XY stage upon the electron beam can be minimized to be negligible. In such a magnetic shield construction, magnetic disturbance by the driving system, etc., which is disposed outside the construction, can also be avoided. Therefore, a stable and reliable electron beam irradiation can be obtained. The upper shield plate 1 (FIG. 1) also protects the wafer 7 from the magnetic effects of the electron lenses disposed above the shield plate. In an apparatus in which the electron beam is deflected by an electromagnetic force, it is desirable to dispose ferrite material around the beam passage hole 3 of the shield plate 1 in order to avoid an eddy current. The magnetic shield effect can be enhanced by using a wafer holder 6 of high permeability and low hysteresis. The shield effect can be further enhanced by forming a shield wall 40, along the periphery edge of the table 5 as illustrated by dotted lines in FIG. 1.

Figure 2:
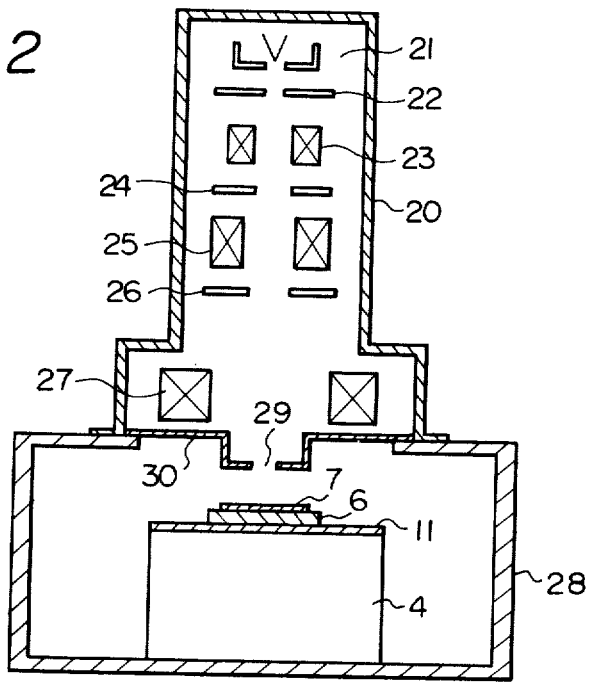
FIG. 2 is a schematic sectional view of an example of an electron beam irradiation apparatus comprising a magnetic shield constructed according to the present invention.

An example of an electron beam irradiation apparatus comprising a magnetic shield construction according to the present invention is illustrated in FIG. 2. An electron beam source 21, an anode 22 for accelerating the electron beam, a beam aligner 23 for correcting the beam path, diaphragm slit plates 24, 26, a condenser electron lens 25, and an object electron lens 27 are disposed within a column body 20. A shield plate 30 having a beam passage hole 29 is secured to the lower end of the column body 20. This shield plate 30 is made of a high permeable material, such as a permalloy. The column body 20 provided with the shield plate 30 is mounted on a vacuum chamber 28 which is made of a high permeable material, such as iron. An XY stage 4, which is substantially the same as that of FIG. 1, is installed within the vacuum chamber 28. In this arrangement, a magnetic shield construction which encloses the XY stage 4 is formed by the floor plate, side walls and the ceiling plate of the vacuum chamber 28 and the shield plate 30 secured to the column body 20.

Figure 3:
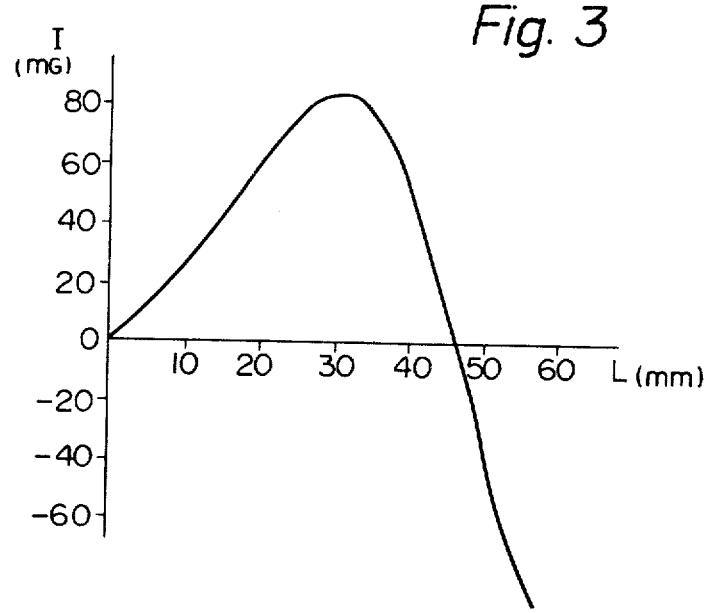
Figure 4:
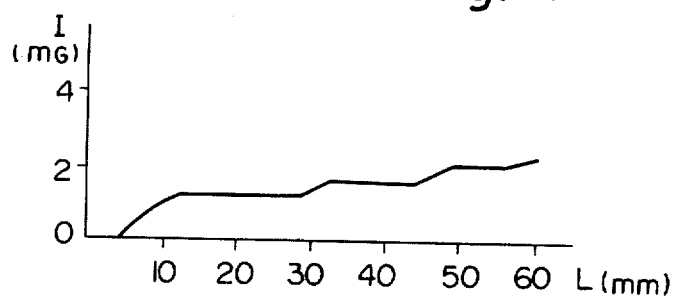

Experimental results of the magnetism change above the table of the XY stage is represented in FIGS. 3 and 4. This experiment was made in the following manner. The wafer holder 6 and the wafer 7 were removed from the apparatus in this experiment. A magnetism sensor was inserted into the apparatus through the beam passage hole 3 and disposed on the center axis of the hole 3 at the location and the level at which the wafer 7 is to be positioned in actual use. Then, the XY stage was moved in either the X direction or the Y direction or in both directions. The XY stage was mounted on an iron base plate. A permalloy plate was supported above the XY stage by iron pillars. FIG. 3 represents a case without a magnetic shield cover plate on the table surface. FIG. 4 represents a case with a permalloy cover plate on the table surface. In each of the graphs, the abscissa represents the amount of shift L (mm) of the XY stage in the direction of horizontal and the ordinate represents the magnetic intensity I (mG) measured at the beam passage hole. Magnetic intensity of the XY stage without the magnetic shield construction of the present invention was 300~350 mG. Magnetism corresponding to the difference between the maximum intensity and the minimum intensity acts upon the electron beam as magnetic disturbance. In the case of FIG. 3, the magnetic disturbance value is about 170 mG. In the case of FIG. 4, the magnetic disturbance value is above 3 mG. The experimental results show that it is possible to depress the magnetic disturbance upon the electron beam within a tolerance limit.

The magnetic shield effect of the present invention is graphically illustrated in FIG. 5. The graph represents a magnetic intensity distribution of the leaked magnetism from the XY stage on the center axis of, and around the beam passage hole 3. As can be seen from the graph, the magnetic intensity on the center axis of the beam passage hole 3 is only 2–3% of the magnetic intensity of the XY stage. Even at a point 10 mm apart from the center axis of the beam passage hole 3, the magnetic intensity is about 50% of the magnetic intensity of the XY stage. The distribution of the magnetic intensity is approximately represented by a parabola line as illustrated in FIG. 5. In the area near the center axis of the beam passage hole 3 (within 5 mm from the center axis), the magnetic intensity is less than 10% of the magnetic intensity of the XY stage, that is, below a tolerance amount for electron beam irradiation. An exposure or scanning area of the electron beam irradiation apparatus is about 3 mm × 3 mm. Therefore, the magnetic intensity in the area near the center axis does not degrade the electron beam irradiation accuracy. A slight increase of the magnetic intensity in the area near the center axis of the beam passage hole 3 can be compensated by a control circuit of the electron beam irradiation apparatus.

The principle of the magnetic shield according to the present invention will now be explained with reference to FIGS. 6 through 8. Suppose the XY stage of a magnetic material is a magnet, and that this magnet comprises two components, one having horizontally disposed N, S poles, and the other having vertically disposed N, S poles. Magnetic flux from each of the components flows as follows.

A horizontal magnet component is illustrated in FIG. 6. Magnetic flux 105 is emitted from a horizontal magnet component 106, as shown by arrows, and flows into a magnetic shield plate 104 disposed above the magnet 106 and shield members 101, 102, 103 which enclose the magnet 106 and the shield plate 104. Therefore, magnetic disturbance is minimized under a passage hole 107 of the shield member 101.

A vertical magnet component is illustrated in FIG. 7. Magnetic flux 105 emitted from a vertical magnet component 106' flows into the upper shield plate 101 through the magnetic shield plate 104 disposed above the magnet and then flows through the side members 102 and the base member 103. A dead space of magnetic flux is formed at the center of the passage hole 107 of the upper shield plate 101. The dead space is maintained if the shield plate 104 is shifted so that magnetism change due to the magnet movement is minimized.

The principle of the magnetic shield construction of the present invention against magnetism from the outside is explained with reference to FIG. 8. Magnetic flux 105a from the outside flows into the side plate 102 and forms a magnetic path 108. A part of the magnetic flux 105a penetrates the side member 102 and flows into the upper plate 101 or flows into the shield plate 104, as shown by arrows 109. Therefore, the magnetic flux does not flow through the space under the portion of the passage hole 107.

I claim:

1. An electron beam irradiation apparatus comprising:
   a base plate of a magnetically permeable material;
   a movable stage mounted on said base plate;
   an upper magnetic shield plate disposed above said stage and having an electron beam passage hole formed therethrough;
   side members of high magnetic permeability which magnetically interconnect said base plate and said upper shield plate; and
   a magnetic shield cover plate which covers the table surface of said stage.

2. An electron beam irradiation apparatus according to claim 1, in which said stage is an XY stage.

3. An electron beam irradiation apparatus according to claim 1 or 2, further comprising a drive guide member for said stage and a magnetic shield plate disposed along the drive guide member of said stage.

4. An electron beam irradiation apparatus according to claim 1 or 2, in which a magnetic shield wall is formed to project along the periphery edge of said magnetic shield cover plate.

5. An electron beam irradiation apparatus according to claim 1 or 2, further comprising floor, side and upper plates in which said stage is housed of a material of high magnetic permeability to form a vacuum chamber; the floor plate and the side plates of said vacuum chamber serving as said base plate and said side members, respectively; an electron beam irradiation mechanism; a colum body for housing said irradiation mechanism; and a magnetic shield plate having a beam passage hole formed therethrough and disposed at the lower end of the column body and the upper end of the vacuum chamber; said magnetic shield plate of said column body and the upper plate of said vacuum chamber serving as said upper magnetic shield plate.

6. An electron beam irradiation apparatus according to claim 3, in which a magnetic shield wall is formed to project along the periphery edge of said magnetic shield cover plate.

7. An electron beam irradiation apparatus according to claim 3, further comprising floor, side and upper plates in which said stage is housed of a material of high magnetic permeability to form a vacuum chamber; the floor plate and the side plates of said vacuum chamber serving as said base plate and said side members, respectively; an electron beam irradiation mechanism; a column body for housing said irradiation mechanism; and a magnetic shield plate having a beam passage hole formed therethrough and disposed at the lower end of the column body and the upper end of the vacuum chamber; said magnetic shield plate of said column body and the upper plate of said vacuum chamber serving as said upper magnetic shield plate.

8. An electron beam irradiation apparatus according to claim 4, further comprising floor, side and upper plates in which said stage is housed of a material of high magnetic permeability to form a vacuum chamber; the floor plate and the side plates of said vacuum chamber serving as said base plate and said side members, respectively; an electron beam irradiation mechanism; a column body for housing said irradiation mechanism; and a magnetic shield plate having a beam passage hole formed therethrough and disposed at the lower end of the column body and the upper end of the vacuum chamber; said magnetic shield plate of said column body and the upper plate of said vacuum chamber serving as said upper magnetic shield plate.

9. The apparatus of claim 1, wherein said stage is a stage having X and Y tables and wherein said apparatus further comprises first guide means formed of a magnetic material for mounting the Y table on the X table, a magnetic shield plate for covering said first guide means, second guide means formed of a magnetic material for said X table arranged between said X table and said base plate, and a magnetic shield plate for covering said second guide means.

10. An electron beam irradiation apparatus according to claim 9, further comprising floor, side and upper plates in which said stage is housed of a material of high magnetic permeability to form a vacuum chamber; the floor plate and the side plates of said vacuum chamber serving as said base plate and said side members, respectively; an electron beam irradiation mechanism; a column body for housing said irradiation mechanism; and a magnetic shield plate having a beam passage hole formed therethrough and disposed at the lower end of the column body and the upper end of the vacuum chamber; said magnetic shield plate of said column body and the upper plate of said vacuum chamber serving as said upper magnetic shield plate.

11. An electron beam irradiation apparatus according to claim 9 or 10, in which a magnetic shield wall is formed to project along the periphery edge of said magnetic shield cover plate.

12. The apparatus of claim 9, wherein said first guide means comprises a pair of guide rails, each rail having a first member secured to the Y table and a second member secured to the X table and wherein said magnetic shield plate for said first guide means comprises a first magnetic shield plate for covering the lower surface of said first rail member and a second magnetic shield plate for covering the upper surface of said second rail member.

13. The apparatus of claim 9 or 12, wherein said second guide means comprises a third guide rail secured to said base plate between said X table and said base plate and wherein said magnetic shield plate for said second guide means comprises a third magnetic shield plate for covering the upper surface of said third guide rail.

14. The apparatus of claim 1 or 9, further comprising a wafer holder for positioning on said movable stage which is formed of a material of high permeability and low hysteresis.

15. The apparatus of claim 5, further comprising a wafer holder for positioning on said movable stage which is formed of a material of high permeability and low hysteresis.

* * * * *